US007256992B1

(12) United States Patent
Stewart et al.

(10) Patent No.: US 7,256,992 B1
(45) Date of Patent: Aug. 14, 2007

(54) SYSTEM FOR MOUNTING AND COOLING CIRCUIT BOARDS

(75) Inventors: Thomas E. Stewart, Saratoga, CA (US); Timothy W. Olesiewicz, Cupertino, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 225 days.

(21) Appl. No.: 10/930,468

(22) Filed: Aug. 31, 2004

(51) Int. Cl.
*G06F 1/20* (2006.01)

(52) U.S. Cl. ............... 361/687; 711/114; 165/80.3; 312/204

(58) Field of Classification Search ........ 361/679–687, 361/724–727, 695, 697; 312/223.2, 204; 711/114; 165/80.3
See application file for complete search history.

(56) References Cited

U.S. PATENT DOCUMENTS

| 6,400,568 | B1 | 6/2002 | Kim et al. |
| 6,626,233 | B1* | 9/2003 | Connors .................... 165/80.3 |
| 6,678,157 | B1 | 1/2004 | Bestwick |
| 6,778,386 | B2 | 8/2004 | Garnett et al. |
| 6,900,387 | B2 | 5/2005 | Gravell et al. |
| 6,924,977 | B2* | 8/2005 | Bestwick et al. ........... 361/687 |
| 6,932,696 | B2 | 8/2005 | Schwartz et al. |
| 7,035,097 | B2* | 4/2006 | Petrov et al. ............... 361/685 |
| 2003/0030976 | A1 | 2/2003 | Garnett et al. |
| 2003/0214782 | A1 | 11/2003 | Osborn et al. |
| 2004/0010660 | A1* | 1/2004 | Konshak et al. ............ 711/114 |
| 2004/0145869 | A1* | 7/2004 | Tanaka et al. .............. 361/695 |
| 2005/0041391 | A1 | 2/2005 | Wrycraft et al. |

* cited by examiner

*Primary Examiner*—Hung Van Duong
(74) *Attorney, Agent, or Firm*—Meyertons Hood Kivlin Kowert & Goetzel, P.C.; B. Noël Kivlin; Chris D. Thompson

(57) ABSTRACT

A computer system may include one or more modules coupled to a backplane in a housing. A module support structure may allow cooling air to flow upwardly across the modules. In one embodiment, a power section of the module may be located downstream of a data section of the module. In another embodiment, offset brackets may hold a circuit board of a module at an offset relative to a pair of guides in a module support structure. In another embodiment, a heat sink may be coupled between heat producing components on a pair of adjacent modules. In another embodiment, a converter apparatus may support a plurality of modules in a different number of slots in a system. In another embodiment, a heat sink on a module may include a pair of heat pipes arranged such that the heat pipes diverge from one another toward the condenser ends of the heat pipes.

26 Claims, 10 Drawing Sheets

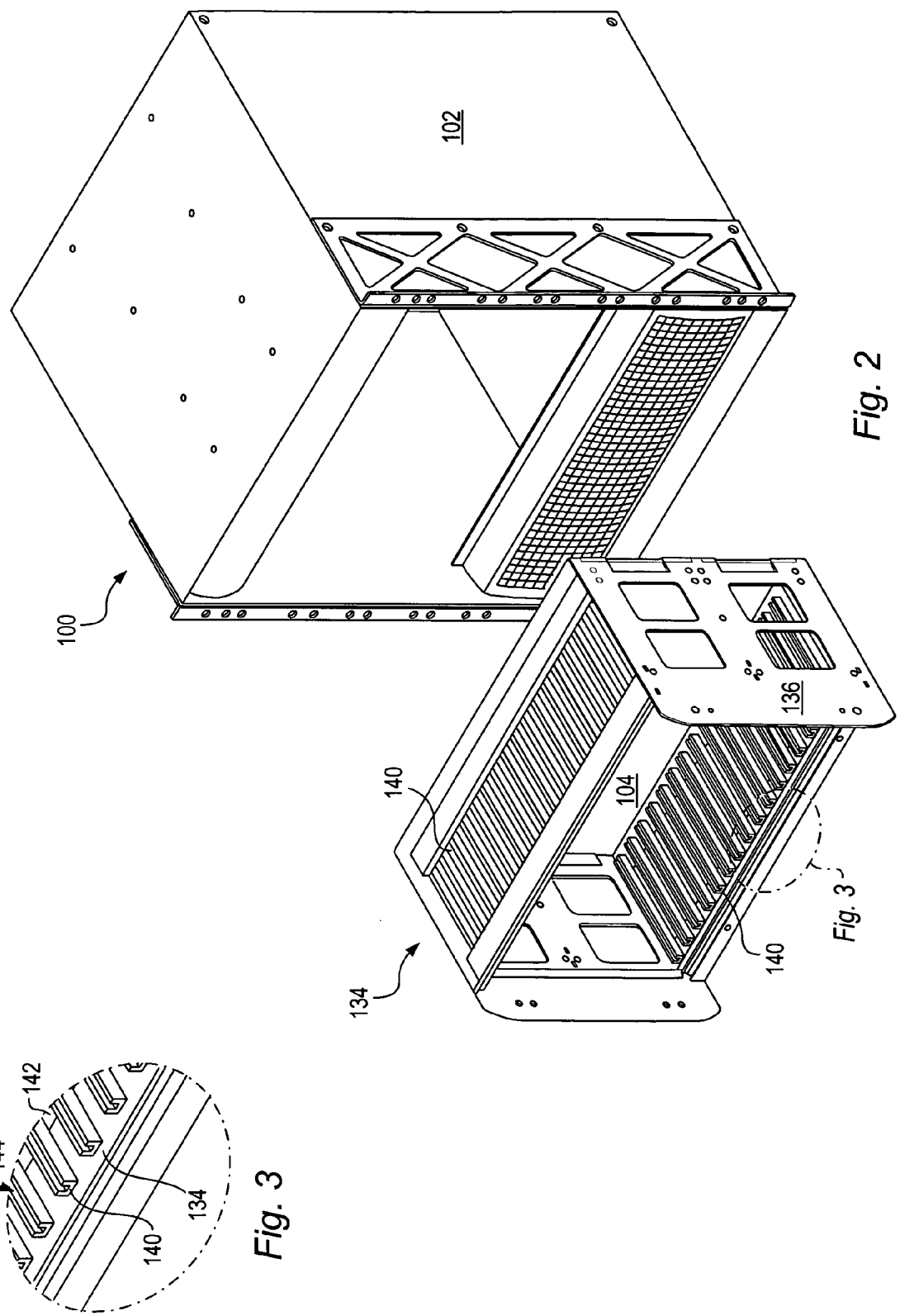

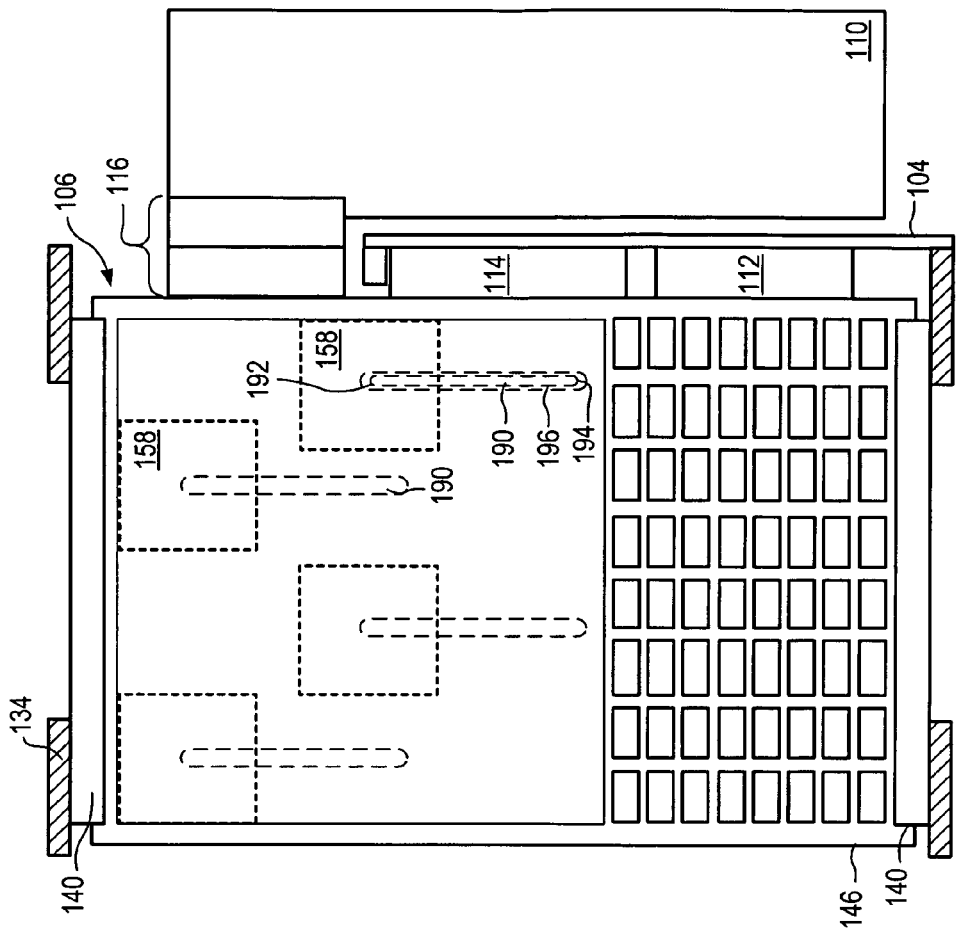
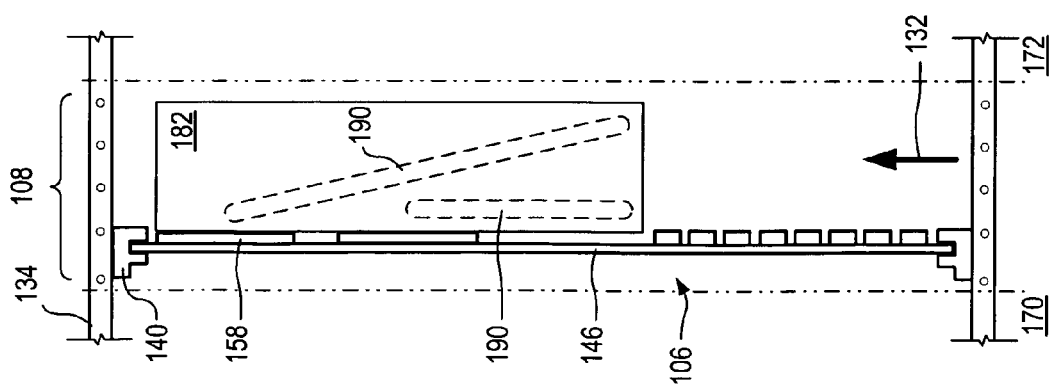
Fig. 11
Fig. 10

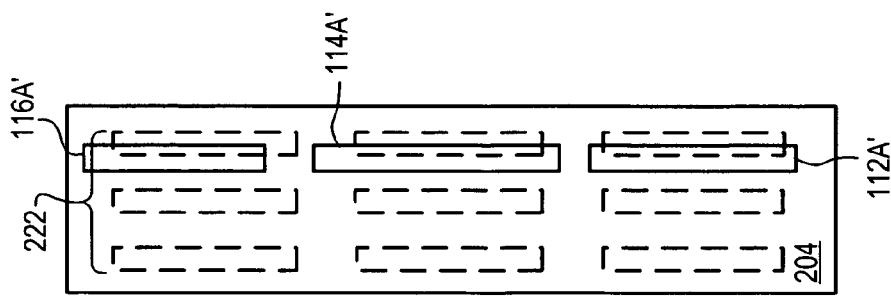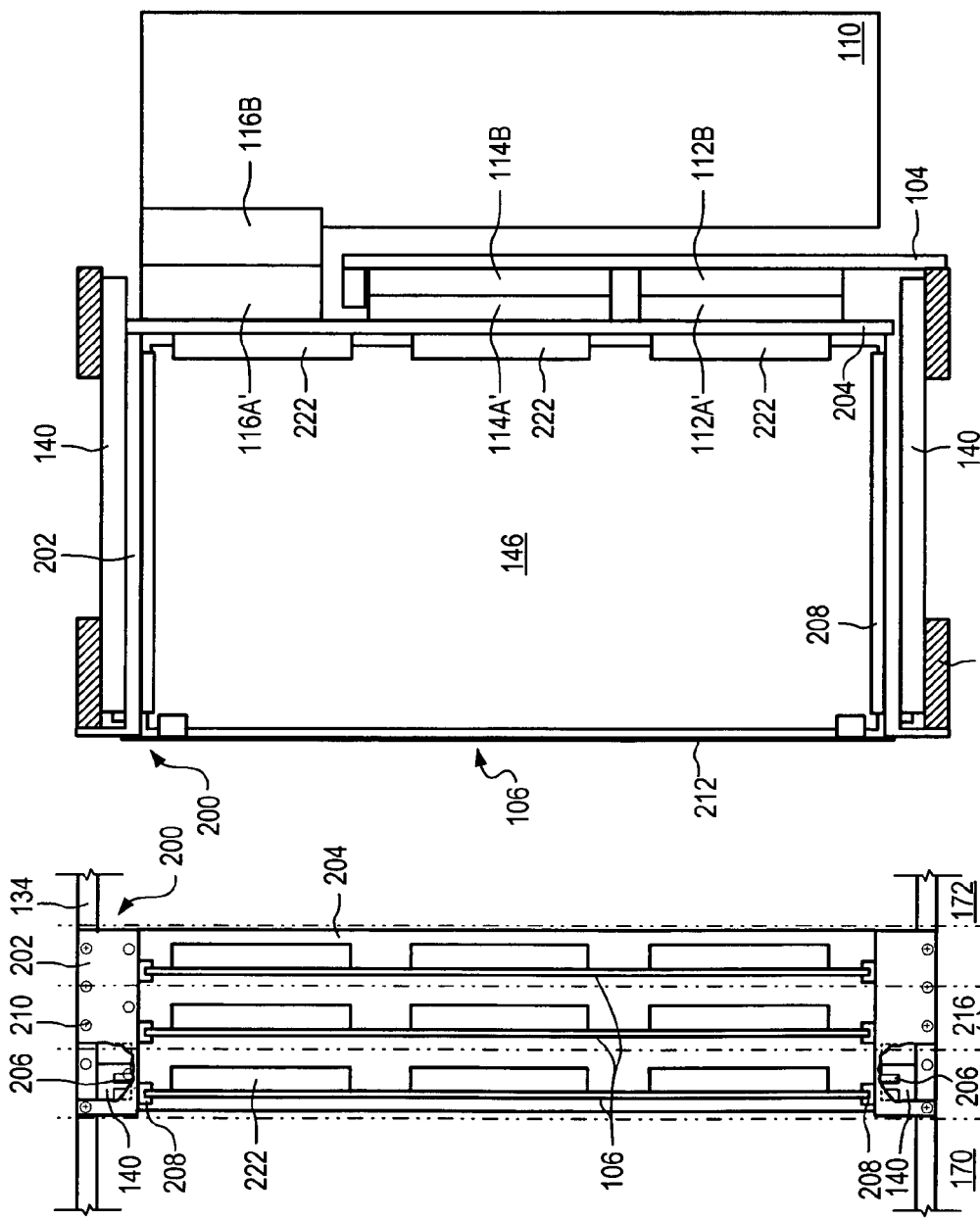

SYSTEM FOR MOUNTING AND COOLING CIRCUIT BOARDS

BACKGROUND OF THE INVENTION

1. Field of the Invention

This invention relates generally electronic equipment, such as computers, and, more particularly, to apparatus and methods for mounting and cooling circuit boards in racks.

2. Background Information

Computer systems often require high reliability and high capacity of operation. Various approaches have been taken to providing such high-performance, high reliability systems. For example, many computer systems include redundant resources so that if one component of the system develops a fault, the computer system remains operational using the redundant resources.

High density systems are typically rack mountable, with one or more processor modules occupying a prescribed space (e.g., a vertical slot) in the rack. A trend in recent times is to make the computers with smaller form factors. This means that more processors can be located in a rack. This has the advantage of increasing the processing density within the racks, and also the advantage of reducing the distance between the computer systems.

Components of computer systems may generate substantial amounts of heat during operation. Higher operating temperatures in electronic components are associated with decreased reliability of the components. To address this issue, some systems include fans or blowers to force air over the heat-generating components to cool the components. Because the cooling air is heated by the components as it passes over them, the cooling air temperature is warmer when it passes over downstream components (e.g., components near an air outlet in a enclosure) than when the cooling air passes over upstream components (e.g., components near an air inlet in a enclosure). Cooling effectiveness for the downstream components in a system may therefore be reduced.

Many standards have been produced for computer systems and their components. One such standard is the PICMG (PCI Industrial Computer Manufacturers Group) 3.0 specification for advanced telecommunications computing architecture (ATCA). Standards such as PICMG 3.0 may specify physical dimensions or arrangement of elements in a system (e.g., a location, size, or envelope of a circuit board in a rack-mounted system). For example, limits may be placed on a location and "footprint" of a circuit board on a backplane. A standard may also set a limit on the number of node slots in a rack of a given size. For example, in a typical PICMG 3.0 system, a chassis may provide 16 node slots.

It would be desirable to have computer systems that provide more effective cooling of components. It would further be desirable to have computer systems with increased component (e.g., processor) density. It would be further desirable that components of such systems be compatible with industry standards such as PICMG 3.0.

SUMMARY OF THE INVENTION

In an embodiment, a computer system may include one or more modules coupled to a backplane in a housing. A module support structure in the housing may allow cooling air to flow upwardly across the modules. At least one of the modules may comprise a data section and a power section. The power section of the module may be located above the data section such that the cooling air passes over components of the data section before it passes over components of the power section. In some embodiments, the power section and a power connector may be located on an upper portion of the module.

In some embodiments, a form factor of a module may conform to a PICMG 3.0 specification for a front board. A module support structure and backplane of the system may receive the module in a vertically inverted orientation relative to a standard orientation according to the PICMG 3.0 specification, such that a power connector of the module is on an upper portion of the module when the module is installed in the housing. A power section of the module may be adjacent to the power connector.

In an embodiment, a bracket may hold a circuit board at an offset from a guide in a housing. The bracket may include a rail that slidably engages the guide. In some embodiments, a pair of brackets may hold a circuit board at an offset from a pair of opposing guides in a module support structure. In certain embodiments, offset brackets may include inner guides that slidably receive edges of a circuit board.

In an embodiment, a pair of offset brackets may hold a circuit board of a module in a substantially centered position in a slot of a system. Components may be mounted to both sides of the circuit board. In certain embodiments, the module may include at least one processor on each side of the circuit board. Apertures may be provided in the brackets to facilitate a flow of cooling air over the circuit board. In some embodiments, the apertures may be sized to balance a flow of cooling air between opposing sides of the circuit board.

In some embodiments, a module having offset (e.g., centering) brackets for a circuit board may reside within an envelope according to a PICMG 3.0 specification when installed in a slot of a system. The system may include a combination of modules having centered and non-centered modules in adjacent slots of the system.

In an embodiment, a heat sink may be coupled between heat producing components on adjacent modules of a system. The heat sink may transfer heat away from the heat producing components and reject the heat into a cooling air stream. In some embodiments, a heat sink may include embedded heat pipes to facilitate cooling of the heat producing components. In one embodiment, a heat pipe may be shared between components on the adjacent modules. In certain embodiments, a heat pipe may include a separate evaporator end proximate to each of a plurality of heat producing components.

In an embodiment, a converter apparatus may hold a certain number modules in a different number of slots in a system. In some embodiments, the number of modules held may be greater than the number of slots (e.g., 3 modules in 2 slots). In other embodiments, the number of modules may be less than the number of slots (e.g., 2 modules in 3 slots).

In one embodiment, a converter apparatus may include a cage assembly having a pair of opposing converter brackets. The converter brackets may include outer rails that engage guides in a module support structure and inner guides that receive modules. In some embodiments, the brackets may include apertures to facilitate a flow of cooling air over the modules. In some embodiments, a converter apparatus may include an interconnect circuit board. The interconnect circuit board may provide electrical connections between the modules in the converter apparatus and a backplane of a system. In certain embodiments, a converter apparatus may allow a plurality of modules to be installed in a subrack that is compliant with a PICMG 3.0 specification.

In an embodiment, a heat sink may be coupled to a plurality of heat producing components. Heat pipes may be embedded in the heat sink for each of the heat producing components. The heat pipes may be arranged to diverge from one another toward the condenser ends of the heat pipes. In one embodiment, the heat pipes may be arranged in a disconnected "Y" pattern. In some embodiments, heat pipes in a heat sink may be arranged to cool a plurality of heat producing components when the components are aligned with a flow axis of the heat sink.

In an embodiment, a module may include two or more rows of heat producing components. Pairs of heat pipes may be embedded in a heat sink on the heat producing components to transfer heat away from the components. In one embodiment, the pairs of heat pipes may be arranged such that the heat pipes diverge toward the condenser ends of the heat pipes in a disconnected "Y" pattern. In one embodiment, a module comprising at least 6 processors may be installed in two slots of a PICMG 3.0 compliant subrack.

BRIEF DESCRIPTION OF THE DRAWINGS

Other aspects of the invention will become apparent upon reading the following detailed description and upon reference to the accompanying drawings in which:

FIG. 2 depicts an exploded view of a computer system including a subrack.

FIG. 3 depicts a detail view of a guide on a subrack taken substantially in zone 3 of FIG. 2.

FIG. 10 depicts a front view of a module including multiple processors with a shared heat sink.

FIG. 11 depicts a side view of a front module including multiple processors with a shared heat sink.

FIG. 16 depicts a front view of a computer system including a converter cage assembly.

FIG. 17 depicts an internal side view of a computer system including a converter cage assembly.

FIG. 18 depicts a rear view of an interconnect circuit board.

Figure 1:
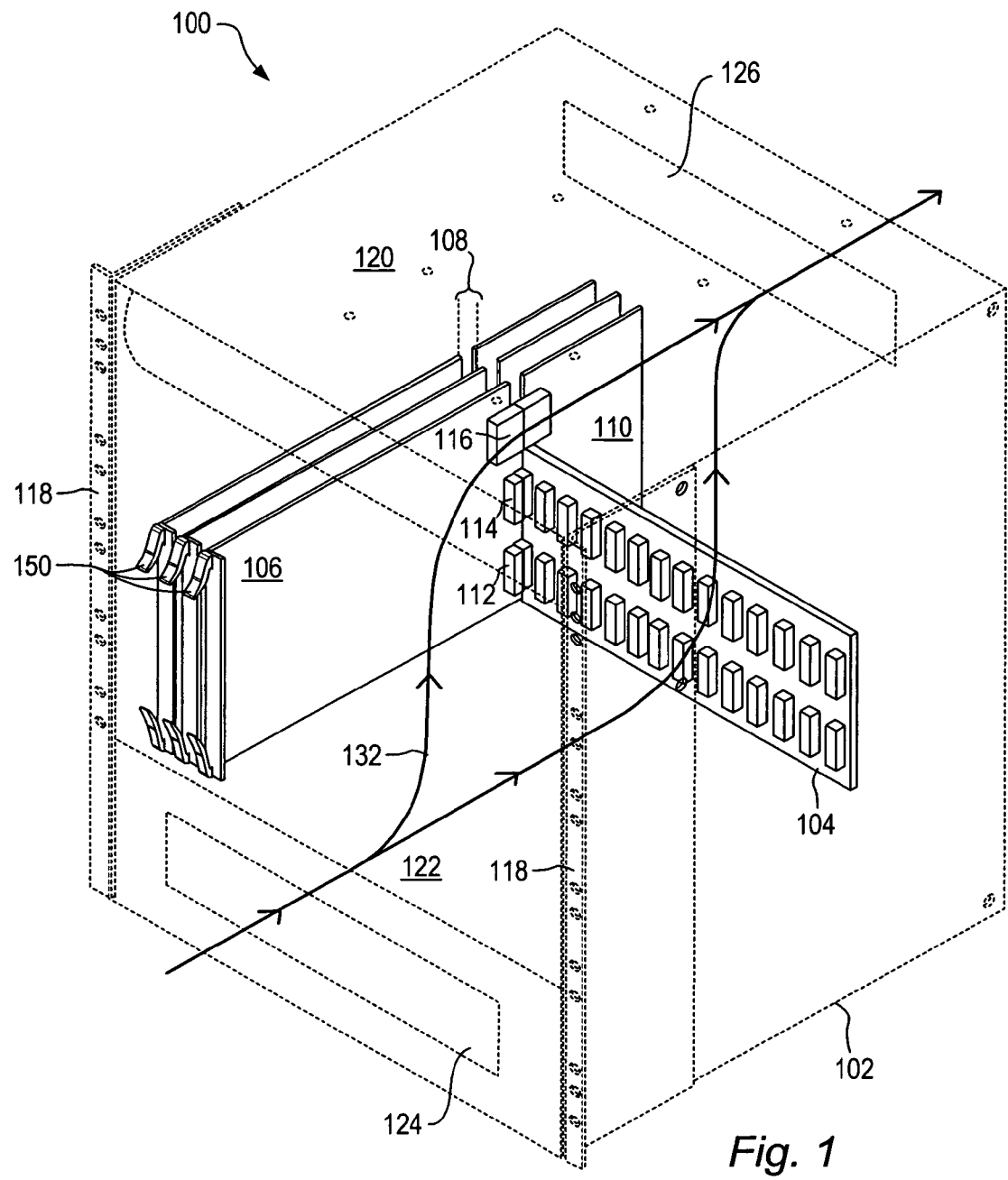
FIG. 1 depicts a schematic view of a computer system including removable modules.

While the invention is susceptible to various modifications and alternative forms, specific embodiments thereof are shown by way of example in the drawings and will herein be described in detail. It should be understood, however, that the drawings and description thereto are not intended to limit the invention to the particular form disclosed, but, on the contrary, the invention is to cover all modifications, equivalents, and alternatives falling with the spirit and scope of the present invention as defined by the appended claims.

DETAILED DESCRIPTION OF THE INVENTION

The following description generally relates to computer systems and methods of mounting, arranging, and cooling computer systems. Such computer systems and methods may be used in a variety of applications. A non-exhaustive list of such applications includes: telecommunications network server systems; e-commerce web server systems; LAN application and file server systems; and remote vehicle control systems. In certain embodiments, a computer system may be used in networks employing advanced telecommunications network architecture (ATCA).

As used herein, a "module" includes any modular unit or subsystem. Examples of a module include, but are not limited to, a printed circuit board assembly, an information processing cartridge, a power supply, a disk drive, or a combination thereof. A module may include multiple circuit boards (e.g., a mezzanine card mounted to a main circuit board). Modules may be various shapes, including, but not limited to, rectangular, triangular, or an irregular shape. In certain embodiments, components of a module may be housed in an enclosure. Sides of an enclosure for a module may include perforations or other openings to allow for a flow of cooling air through the enclosure. In some embodiments, a module may be replaceable in the field. Such a module may be referred to herein as a Field Replaceable Unit (FRU). In some embodiments, a module may be hot-swappable.

A module may include a variety of components, including, but not limited to, printed circuit boards, processors, memory components, disk drives, transformers, capacitors, and connectors. Examples of processors that may be used include, but are not limited to, an UltraSPARC™ processor, Intel x86 series and compatible processors, AMD x86 compatible processors, Alpha processors and PowerPC processors. Memory devices may include various forms, such as buffered dynamic random access memory (DRAM) on dual in line memory modules (DIMMs). In some embodiments, memory may be provided on riser cards coupled to a main circuit board.

Each module within a shelf may run under the same operating system or a plurality of different operating systems may be used. Examples of possible operating systems include Sun Microsystems' Solaris® OS or another UNIX™-Type OS such as Linux™, MINIX™, or Irix™, or UNIX™ or a Microsoft OS such as Windows NT™, Windows 2000™, Windows ME/98/95™, Windows XP™. Modules may execute various types of program software. Examples of program software include, but are not limited to, telecommunications software, fileserver software, mailserver software, webhosting software, database software, firewall software, or verification software.

As used herein, a "circuit board" includes any assembly or structure that carries electrical components (including, but not limited to, semiconductor devices, resistors, capacitors, relays, switches, and connectors) or electrical connections for a system. "Circuit board" includes, but is not limited to, a printed circuit board made of fibreglass and metal layers. As used herein, "component" includes any element of system, including, but not limited to, a processor, a resistor, a power supply, a disk drive, or a printed circuit board.

As used herein, a "chassis" includes any structure that supports or houses one or more elements of a computer system (e.g., electronic modules). A component may be supported in a chassis by various structures including, but not limited to, slides, rails, a shelf, or a bottom wall of a chassis.

In some embodiments, a series of modules may be arranged on a shelf of a computer system in the form of generally rectangular slabs. Such modules may be referred to herein as "blades." In some embodiments, each of a series of modules may operate as a computer server. Such information processing modules may be referred to herein as "server blades." A server blade may include components and subsystems including, but not limited to, one or more central processing units, a power conversion subsystem, memory components, and disk drives. In certain embodiments, components on a module may be dedicated to a specific function, such a power conversion, information processing, or data storage.

FIG. 1 depicts a schematic perspective view of computer system 100. Components of computer system 100 may reside in housing 102. Computer system 100 may include backplane 104. A number of front modules 106 may be coupled to backplane 104. Backplane 104 and front modules 106 may be supported in an internal support structure (not shown in FIG. 1 for clarity). Electrical connectors 112 and 114 may couple backplane 104 with front modules 106. In the example shown in FIG. 1, housing 102 may receive up to sixteen front modules 106 in vertically oriented slots 108. As used herein, "slot" generally refers to a receiving location for an element (e.g., module) of a system. Each of front modules 106 may be removably mountable in a respective opening in the front of housing 102.

Computer system 100 may include rear modules 110. Rear modules 110 may be coupled to front modules 106 by connector 116. In some embodiments, rear module 110 may couple with backplane 104. Rear modules 110 may be removable through an opening in the rear of housing 102. Rear modules 110 may couple with external cables. Rear modules 110 may serve as transition modules to connect front modules 106 with portions of a system external to housing 102.

Housing 102 may be a three-dimensional, generally rectangular, enclosure. Housing 102 may include mounting rails 118. Mounting rails 118 may be suitable for mounting computer system 100 in generic racking systems. For example, housing 102 may be designed for 19"-wide racking (1"=25.4 mm) as defined, for example, in the IEC297 and EIA 310 specification standards. Housing 102 may be mounted in a rack in various other ways, such as a slide/support system.

Housing 102 may include upper space 120 above front modules 106 and lower space 122 below front modules 106. Upper space 120 and lower space 122 may provide a path for cooling air. Vents 124, 126 may be provided on housing 102. Air may be forced through housing to cool components on front modules 106 and rear modules 110. Cooling air devices (e.g., blowers, fans) may be provided inside housing 102 (e.g., in upper space 120 or lower space 122) or external to housing 102. For example, a series of blowers may be mounted in upper space 120 of housing 102. In certain embodiments, upper space 120 and/or lower space 122 may accommodate other system components such as cabling or power supplies. In certain embodiments, cooling air devices may be included on front modules 106 and/or rear modules 110 to increase an airflow across a portion of the module.

In some embodiments, cooling air may be forced through housing 102 as shown by arrow 132 on FIG. 1. Cooling air may enter through vent 124 on the front of housing 102 and enter into lower space 122. Cooling air may be forced upwardly from lower space 122 and across front modules 106 and rear modules 110 into upper space 120. Cooling air may be forced out of upper space 120 through vent 126 on the rear of housing 102. A bottom-to-top airflow pattern may conform to a PICMG 3.0 specification. In other embodiments, cooling air may flow in other patterns, such as top to bottom and/or rear to front.

A computer system may include members to control the flow of cooling air through a housing. For example, plenum members may be provided in upper and/or lower spaces of housing 102. As another example, filler panels may be installed in a slot 108 where no module is mounted.

Backplane 104 may be a circuit board that extends across housing 102. Backplane 104 may allow for the electrical interconnection of front modules 106. Backplane 104 may include various elements for keying connectors for insertion of front modules 106 into backplane 104. In some embodiments, backplane 104 may be a double-sided and/or multi-layer printed circuit board assembly. Conductive traces on and through the backplane 104 may be provided to interconnect the various connectors. As shown in FIG. 1, backplane 104 may be partway between of front and rear of a housing. In certain embodiments, backplane 104 may include openings to provide a path for cooling air to pass from the front to the rear of housing 102.

A computer system may include a module support structure to support one or more modules in a housing or rack. As used herein, "module support structure" includes any element or combination of elements that support one or more modules in a computer system. In some embodiments, a module support structure may be a subrack that is removable as a unit from the housing. In other embodiments, a module support structure may include a combination of separate elements (e.g., rails, frames, clips, or mounting brackets). In certain embodiments, a module support structure may be integral to a housing of the computer system.

FIG. 2 depicts a partial exploded view of computer system 100 including subrack 134. Subrack 134 may include frame 136. Lower and upper guides 140 may be attached to frame 136. A rear side of frame 136 may include mounts for backplane 104. Backplane 104 may be attached to subrack 134 using fasteners (e.g., machine screws). Subrack 134 may include components for mounting, alignment, and EMI containment. Front modules 106 (shown in FIG. 1), rear modules 110 (shown in FIG. 1), backplane 104, and subrack 134 may combine to form a shelf.

FIG. 3 depicts a detail view of lower guide 140 on subrack 134. Upper and lower guides 140 may include channels 144. Channel 144 may receive edge of a circuit board of module 106. Guides 140 may be spaced from each other to define openings 142. Openings 142 may allow for passage of cooling air.

Figure 4:
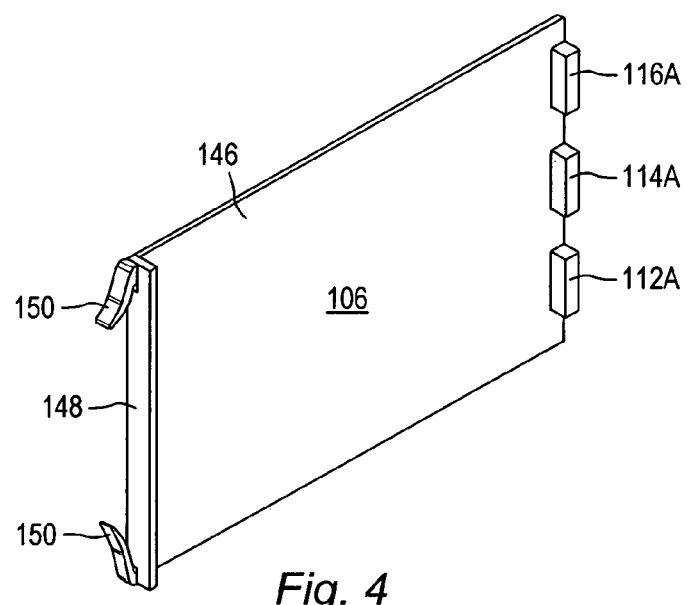
FIG. 4 depicts a perspective view of a front module.

FIG. 4 depicts a perspective view of front module 106. Front module 106 may include printed circuit board 146. In some embodiments, front module 106 may have a form factor meeting a PICMG 3.0 specification. For example, printed circuit board 146 may have a height of 12.25 inches (311.15 mm) and a depth of 11.02 inches (280.0 mm). Front module 106 may be mountable in a subrack having a standard 8U height and a pitch of 1.20 inches (30.48 mm, or 6 HP) per slot. Embodiments designed for other racking systems could have different dimensions. In certain embodiments, front modules may be mountable in a subrack having a 12U height.

Front module 106 may include face plate 148. Levers 150 may be pivotally coupled to face plate 148. Levers 150 may engage complementary features on subrack 134 to facilitate insertion of front module 106 into subrack 134 and/or extraction of front module 106 from subrack 134. Front module 106 may include board connector parts 112A, 114A, 116A. Board connector parts 112A, 114A, 116A may couple with complementary connector parts on backplane 104 (shown in FIG. 1).

In some embodiments, components on a module may be grouped in sections according to purpose. For example, a module may include sections for performing power conversion, data storage, and information processing. As used herein, "power section" includes any section of a module that includes components to convert, regulate, produce, distribute, supply, or condition electrical power. For example, a power section may receive −48VDC input feeds in accordance with a PICMG 3.0 specification and convert the feeds to various voltage rails for use by components of the module. As used herein, "data section" includes any section of a module that includes components for data processing, transmission, storage, and/or retrieval. A data section may have various components, including, but not limited to, central processing units, memory components, and disk drives.

Figure 5:
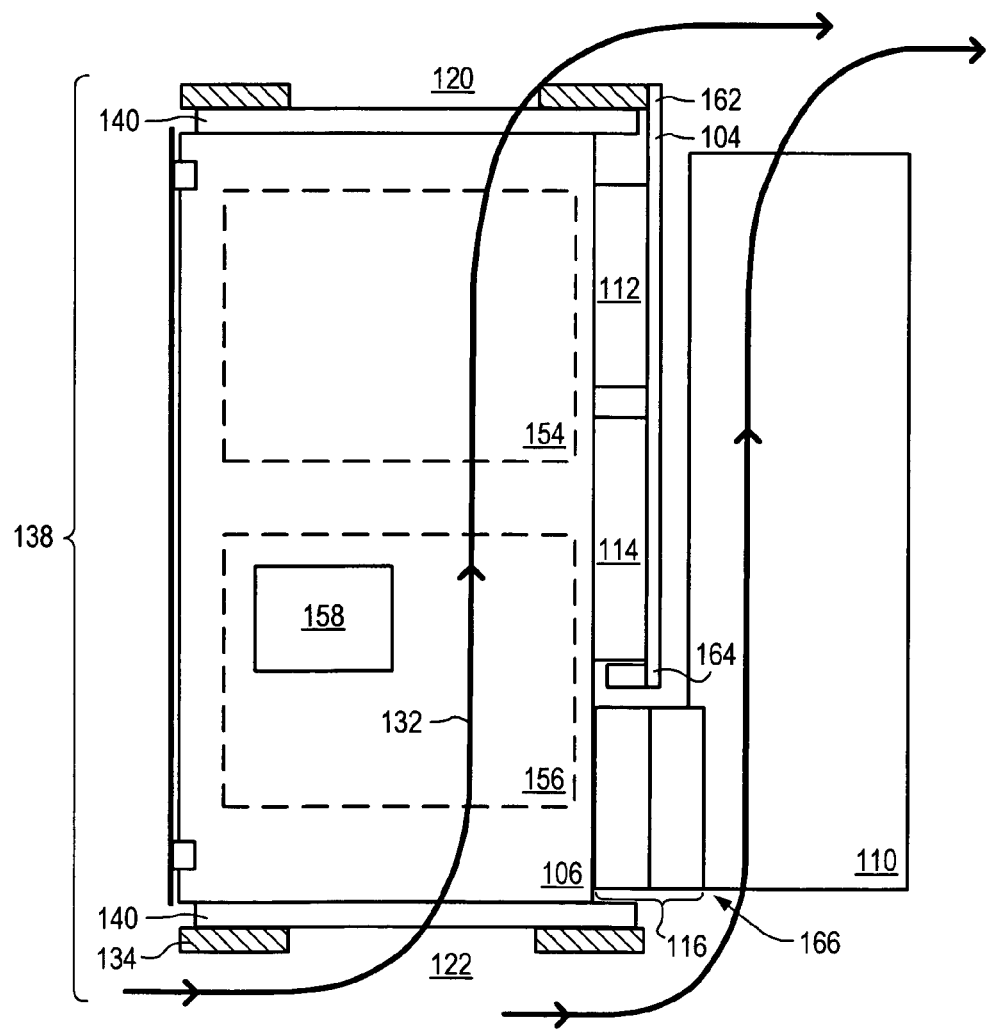
FIG. 5 depicts a side view of a front module having a power section on an upper portion of the module.

In some embodiments, components of a computer system may be arranged such that cooling air flows over more sensitive components (e.g., processors, memory components) on a module before the cooling air flows over less sensitive components (e.g., transformers). In one embodiment, a data section is located on a module upstream from a power section on the module. FIG. 5 depicts a side view of front module 106 in computer system 100. Front module 106 may include data section 156 on a lower portion of front module 106 and power section 154 on an upper portion of front module 106. Data section 156 may include central processing unit 158 and/or other components. Cooling air may flow upwardly across front module 106 in the direction of arrow 132, consistent with a PICMG 3.0 specification. Locating power section 154 downstream from (i.e., above) data section 156 may ensure that air flowing over central data section 156 has not been preheated by heat producing components in power section 154. In some embodiments, components may be located such that operating temperatures are maintained within an acceptable range of an industry standard, such as Telecordia GR63.

In a standard orientation of a shelf according to a PICMG 3.0 specification, a power conversion and shelf management connector (which may be designated as a "Zone 1 connector") is near a bottom of a front board and backplane (e.g., in the area of connector 112 shown in FIG. 1), and a rear transition module interface connector (which may be designated as a "Zone 3 connector") for transferring input/output signals to and from a rear transition module is near a top of the front board (e.g., in the area of connector 116 shown in FIG. 1). In certain embodiments, a shelf of a computer system may be vertically inverted relative to the standard orientation described in a PICMG 3.0 specification, such that a power connector (e.g., a Zone 1 connector) is near the top of a front board and a rear module interface connector (e.g., a Zone 3 connector) is near the bottom of the front board.

As shown in FIG. 5, shelf 138 may be vertically inverted relative to the arrangement shown in FIG. 1. Connector 112 (which may correspond a Zone 1 connector) may couple front module 106 to backplane 104 near a top of front module 106. Connector 116 (which may correspond to a Zone 3 connector) may couple front module 106 to rear module 110 near a bottom of front module 106. As mentioned above, power section 154 may be located in an upper portion of front module 106 so that power components are located downstream from more sensitive components (e.g., processors, memory, or disk drives). Inversion of shelf 138 relative to a standard orientation described in a PICMG 3.0 specification may allow a power connector (e.g., connector 112) to be located closer to a downstream power section 154 and allow a data input/output connector (e.g., connector 116) to be located closer to an upstream data section 156, thereby increasing routing efficiency in the module.

As shown in FIG. 5, when shelf 138 is in an inverted orientation relative to FIG. 1, upper edge 162 of backplane 104 extends to a top edge of front module 106 and is above power section 154. As used herein, an element is generally "above" another element if it is higher in elevation than the other element. Similarly, an element is generally "below" another element if it is lower in elevation than the other element. Backplane 104 may channel cooling air over front module 106 in the upper portion of front module 106, thereby helping to maintain a velocity of cooling airflow over the upper portion of the module. A higher velocity of cooling air over components in the upper portion of the module (e.g., components of power section 154) may increase cooling effectiveness of the system. In addition, when shelf 138 is in an inverted orientation relative to FIG. 1, lower edge 164 of backplane 104 is spaced from a bottom is edge of front module 106 such that opening 166 above is lower space 122 is enlarged. Enlargement of opening 166 may provide a less restrictive path for cooling air flowing to rear module 110, thereby facilitating cooling of rear module 110.

In an embodiment, a circuit board of a module may be mounted in an offset position relative to a guide in a rack structure. Offsetting a circuit board of a module may allow the component of the module to be maintained in a desired position in a predetermined space. For example, offsetting a circuit board relative to a guide may allow for mounting of components on both sides of the circuit board within slot dimensions prescribed by an industry specification. Mounting components on both sides of a circuit board may allow for an increased density of components (e.g., processors, memory components) on the circuit board. An increased density of components may improve reliability (e.g., increase redundancy) in a system.

Figure 6:
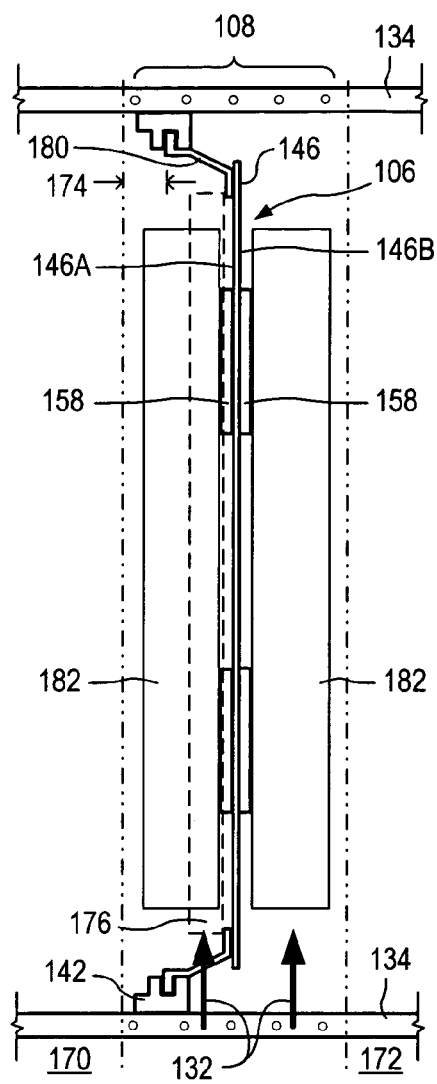
FIG. 6 depicts a module mounted in a subrack on offset brackets.

In one embodiment, a bracket may be used to position a circuit board at a desired location in a slot. FIG. 6 depicts front module 106 in slot 108 of subrack 134. Dividing lines 170, 172 may define the left and right boundaries of slot 108. Upper and lower guides 140 may be a prescribed horizontal distance 174 from left dividing line 170. In one embodiment, dividing lines 170, 172 may be 1.2 inches (30.48 mm) apart and channels 144 of guides 140 may be 0.26 inches (6.61 mm) inches from dividing line 170, in accordance with a PICMG 3.0 specification. Connector zone 176 may be adjacent to guides 140.

Front module 106 may include circuit board 146. Circuit board 146 may be mounted at an offset relative to guides 140. Circuit board 146 may include sides 146A, 146B. Offset brackets 180 may be coupled to side 146A of circuit board 146. Offset brackets 180 may slidably engage guides 140 on subrack 134. Connectors of front module 106 may be in connector zone 176. As shown in FIG. 6, circuit board 146 may be centered relative to dividing lines 170, 172. In some embodiments, a circuit board may be located within a slot (e.g., centered) such that a flow of cooling air is more evenly distributed between opposing sides of the circuit board.

One or more processors 158 may be mounted to both sides of circuit board 146. In one embodiment, two processors 158 may be mounted to each of sides 146A, 146B. In some embodiments, processors 158 on opposing sides of circuit board 146 may be aligned with each other, as shown in FIG. 6. In other embodiments, processors 158 on opposing sides of circuit board 146 may be offset vertically and/or horizontally. Heat sinks 182 may be coupled to processors 158. Heat sinks 182 may include elements to facilitate flow of cooling air over or through portions of the heat sinks and promote rejection of heat from processors 158 into the cooling air (e.g., extruded channels, folded fins).

Figure 7:
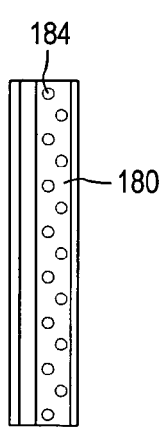
FIG. 7 depicts a top view of an offset bracket including cooling air apertures.

In an embodiment, brackets for a circuit board may include apertures or other elements to promote or control the flow of cooling air across the circuit board. FIG. 7 depicts a top view of offset bracket 180 including apertures 184. Apertures 184 may allow for increased flow of cooling air over side 146A of circuit board 146. In certain embodiments, apertures 184 may be sized to tune a flow of cooling air on either side of the circuit board, or relative to other circuit boards installed in subrack 134. For example, apertures 184 may be sized to provide approximately the same amount of cooling air on both sides of circuit board 146. In certain embodiments, a plate or baffle may be coupled to the side of a circuit board opposite an offset bracket (e.g., side 146B) to balance a flow of cooling air between the two sides of the circuit board or among different circuit boards in a system.

Figure 8:
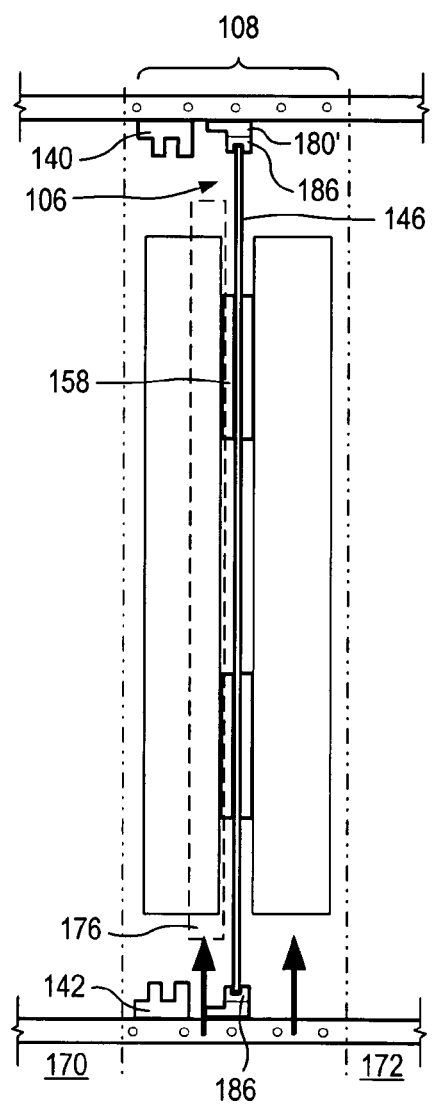
FIG. 8 depicts a module supported by offset brackets that include card edge guides.

In an embodiment, an offset bracket may include guides for receiving a circuit board in an offset location. FIG. 8 depicts front module 106 supported by offset bracket 180'. Guides 186 may be mounted to offset bracket 180'. Guides 186 may receive front modules 106. In some embodiments, offset bracket 180' may be attached to subrack 134 using conventional fasteners (e.g., screws). In other embodiments, offset brackets 180' may be mounted in guides 140.

Figure 9:
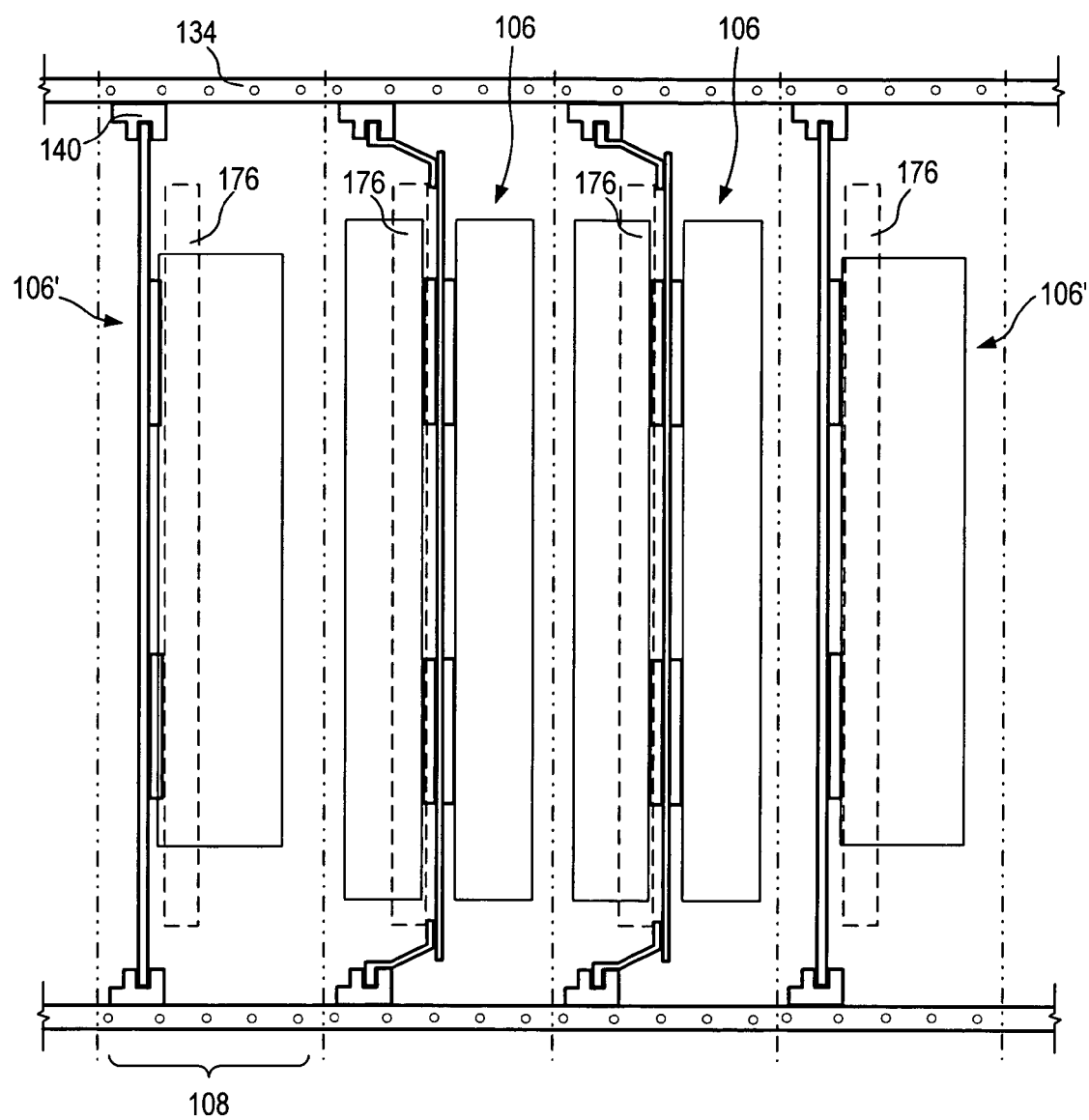
FIG. 9 depicts a computer system including offset and non-offset modules.

In some embodiments, double-sided circuit boards and single-sided circuit boards may be installed in adjacent slots of a subrack having uniform guide locations. FIG. 9 depicts a computer system 100 including subrack 134. Subrack 134 may include guides 140 uniformly positioned with respect to slots 108. Double-sided modules 106 and single-sided modules 106' may be interchangeably installed in any of slots 108 in subrack 134. Connectors for all modules may be positioned in a uniformly located connector zone 176 of slots 108 to allow interchangeability among different slots in subrack 134 (e.g., between modules 106 and 106'). In one embodiment, guide positions in subrack 134 and backplane connector positions may conform to a PICMG 3.0 specification. In another embodiment, guides for some or all of the slots in a subrack may be pre-positioned to center the circuit boards between dividing lines of the slots.

In an embodiment, multiple components (e.g., processors) on a circuit board may share a heatsink. FIGS. 10 and 11 depict front module 106 including processors 158. Heat sink 182 may be coupled to processors 158. Heat pipes 190 may be embedded in heat sink 182 proximate to each of processors 158. Heat pipes 190 may be of various sizes, shapes, and materials. Heat pipes 190 may include evaporator ends 192 and condenser ends 194. Heat pipes 190 may include wicks 196 to facilitate transfer of working fluid from condenser ends 194 to evaporator ends 192. Wick 196 may have various forms, including, but not limited to, sintered powder or screen mesh. In certain embodiments, two or more of processors 158 may share a heat pipe.

Figure 12:
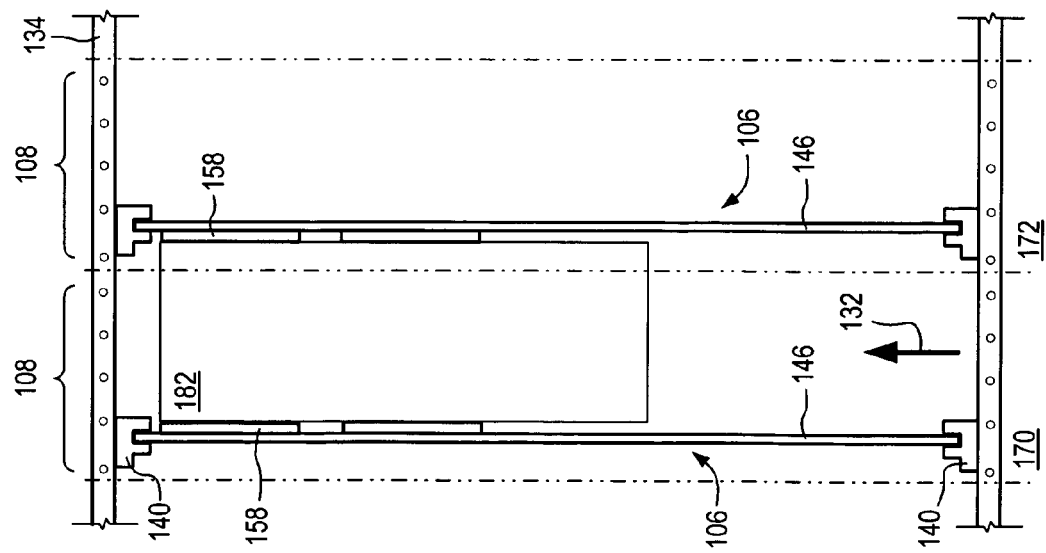
FIG. 12 depicts adjacent modules including processors having a shared heat sink.

In an embodiment, components on adjacent boards may share a heat sink. FIG. 12 depicts front modules 106 in adjacent slots 108 of subrack 134. Heat sink 182 may be sandwiched between processors 158 of adjacent circuit boards 146. In some embodiments, structural members (e.g., brackets) may be used to connect adjacent circuit boards together to form a module assembly. The module assembly may be mounted in two or more two or more adjacent slots in a subrack. In some embodiments, components may be mounted on the sides of circuit boards 146 opposite processors 158.

Figure 13:
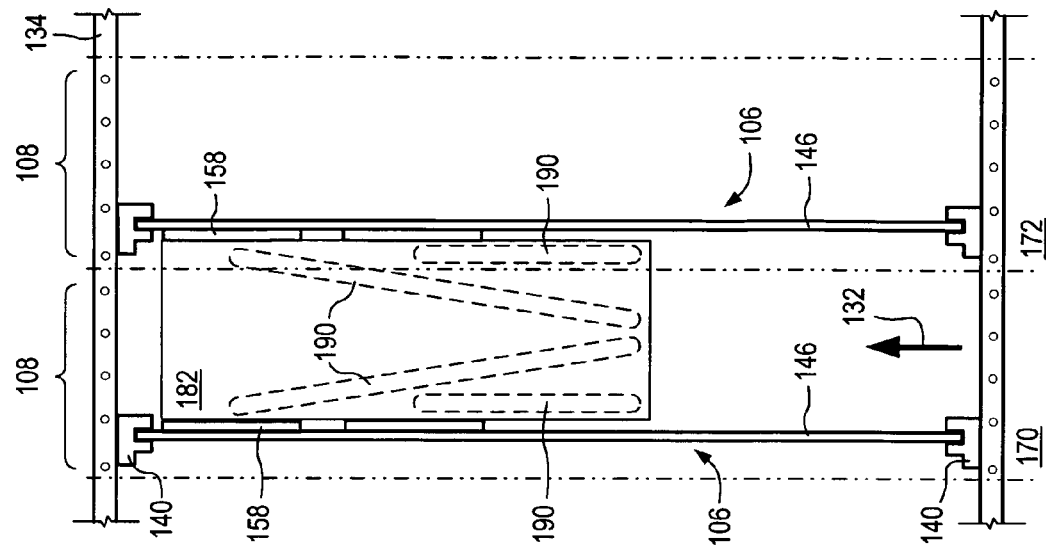
FIG. 13 depicts adjacent modules including processors having a shared heat sink with embedded heat pipes.

In some embodiments, one or more heat pipes may be coupled to a heat sink to promote transfer of heat away from processors or other components on a module. FIG. 13 depicts heat sink 182 including embedded heat pipes 190. In one embodiment, a separate heat pipe 190 is provided for each of processors 158, as shown in FIG. 13.

Figure 15:
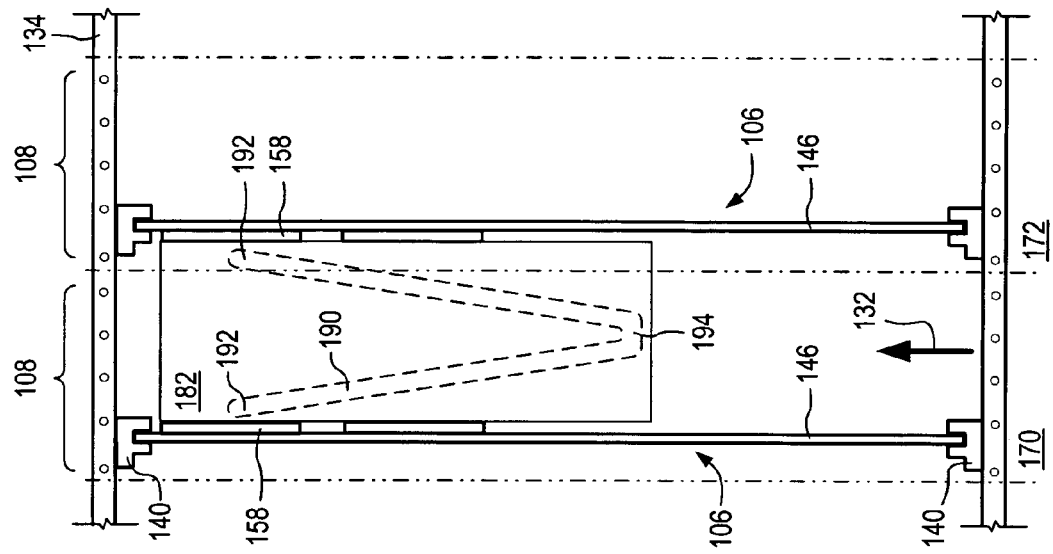
FIG. 15 depicts adjacent modules including processors having a shared heat pipe with multiple evaporator ends.
Figure 14:
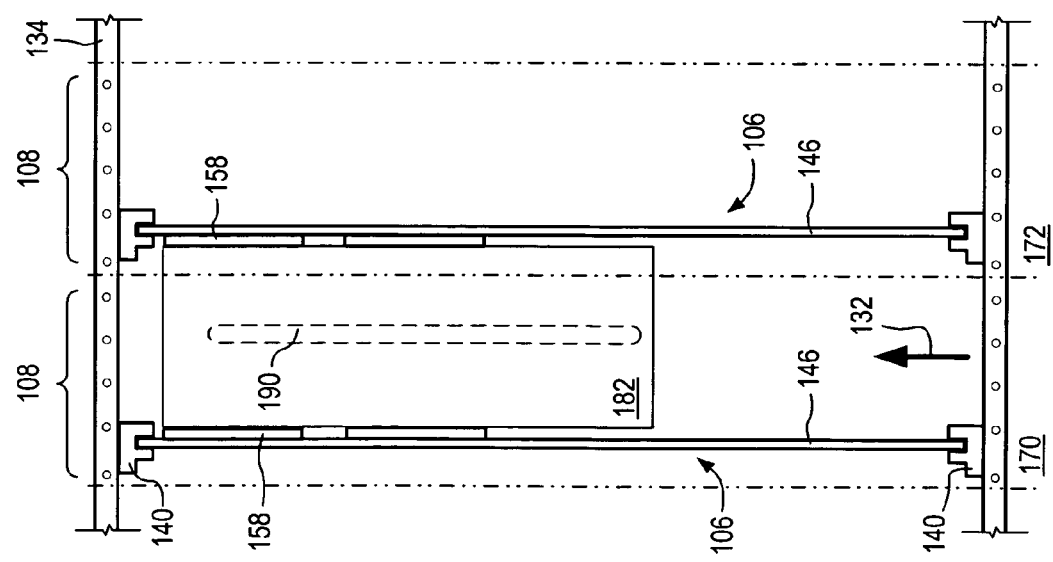
FIG. 14 depicts adjacent modules including processors having a shared heat sink with an embedded heat pipe.

In some embodiments, processors 158 on adjacent circuit boards 146 may share a heat pipe. FIG. 14 depicts heat sink 182 between processors 158 on adjacent circuit boards 146. Heat pipe 190 may be embedded in heat sink 182 between processors 158. In one embodiment, a separate evaporator end may be provided for each of processors 158. FIG. 15 depicts a system including heat sink 182 with V-shaped heat pipe 190. Heat pipe 190 may include evaporator ends 192 proximate to each of processors 158.

In an embodiment, a converter may allow a particular number of modules to be mounted in a different number of slots in a rack. For example, a converter may allow 3 circuit cards to be mounted in 2 slots of a rack. Converters may allow for various other module-to-slot ratios, including, but not limited to, 3-to-1, 3-to-2, 5-to-3, 1-to-2, or 1-to-3. A converter may have various forms, including, but not limited to, a cage, a frame, a bracket, or a box. A converter may have a unitary structure or include multiple structural elements (e.g., separate upper and lower brackets).

FIG. 16 depicts a front view of converter cage assembly 200 in subrack 134. FIG. 17 depicts a side view of converter cage assembly 200 in subrack 134. Converter cage assembly 200 may include conversion brackets 202 and interconnect circuit board 204. Conversion bracket 202 may include outer rails 206 and inner guides 208. Outer rails 206 may slidably engage guides 140 on subrack 134. Fasteners 210 may secure conversion brackets 202 to subrack 134. Front panel 212 may be removably attached to conversion brackets 202 and/or to front modules 106.

Converter cage assembly 200 may mount in slot 108. Slot 108 may be between dividing lines 170, 172. In some embodiments, slot 108 may be a slot in a PICMG 3.0 compliant subrack. Converter cage assembly 200 may include subslots 214. Boundaries of subslots 214 may be defined by subslot dividing lines 216.

FIG. 18 depicts a rear view of interconnect circuit board 204. Connector 222 may couple front modules 106 with interconnect board 204. Connector parts 112A' and 114A' on interconnect circuit board 204 may couple with connector parts 112B and 114B on backplane 104. Connector part 116A' on interconnect circuit board 204 may couple with 116B on rear module 110. Interconnect circuit board 204 may include conductive traces to connect front modules 106 with backplane 104 and rear module 110. In some embodiments, connectors 112, 114, and 116 may conform to a PICMG 3.0 specification. In certain embodiments, one or more of front modules 106 may directly couple to rear modules 110 without an interconnect board.

In some embodiments, a converter may allow a greater aggregate surface area of circuit boards within a given number of slots of a system. For example, converter cage assembly 200 may support three 10.5 inch by 9.5 inch circuit boards 146 having an aggregate surface area (on one side of each board) of 299.2 square inches (3×10.5 inches×9.5 inches), as compared to a single 12.25 inch by 11.02 inch circuit board having a surface area of 135.0 square inches (1×12.25 inches×11.02 inches). A greater aggregate surface area of circuit boards may allow a higher component density for a system.

In some embodiments, conversion brackets 202 of converter cage assembly 200 may include apertures or other elements to facilitate or control a flow of cooling air over front modules 106. Apertures may be of various shapes, sizes and locations. In some embodiments, size and position of apertures may be selected to tune airflow among front modules 106 or between front modules 106 and other components in subrack 134. For example, larger apertures may be provided in conversion brackets 202 for a module that carries components requiring a lower operating temperature, or over components that produce large amounts of heat. In certain embodiments, removable plates, baffles, or other flow control devices may be attached to the brackets to adjust a flow of air across front modules 106.

Figure 20:
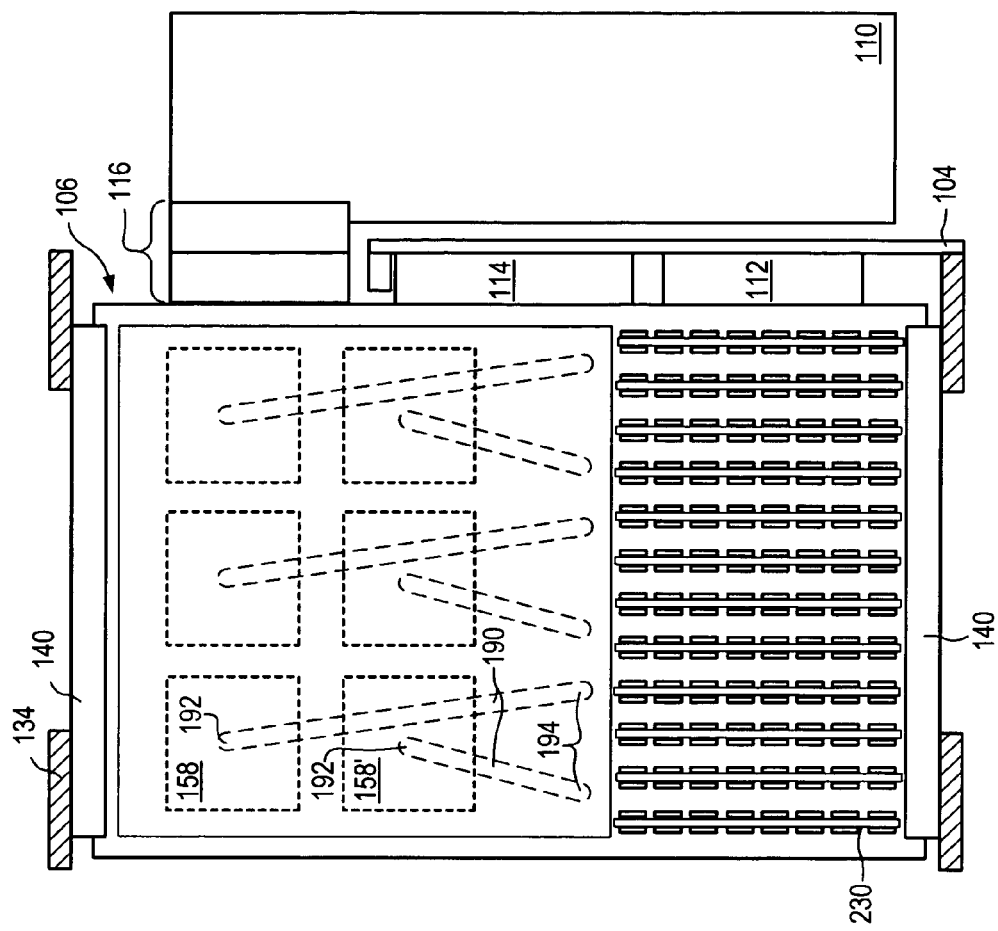
FIG. 20 depicts an internal side view of a multiple processor module including embedded heat pipes.
Figure 19:
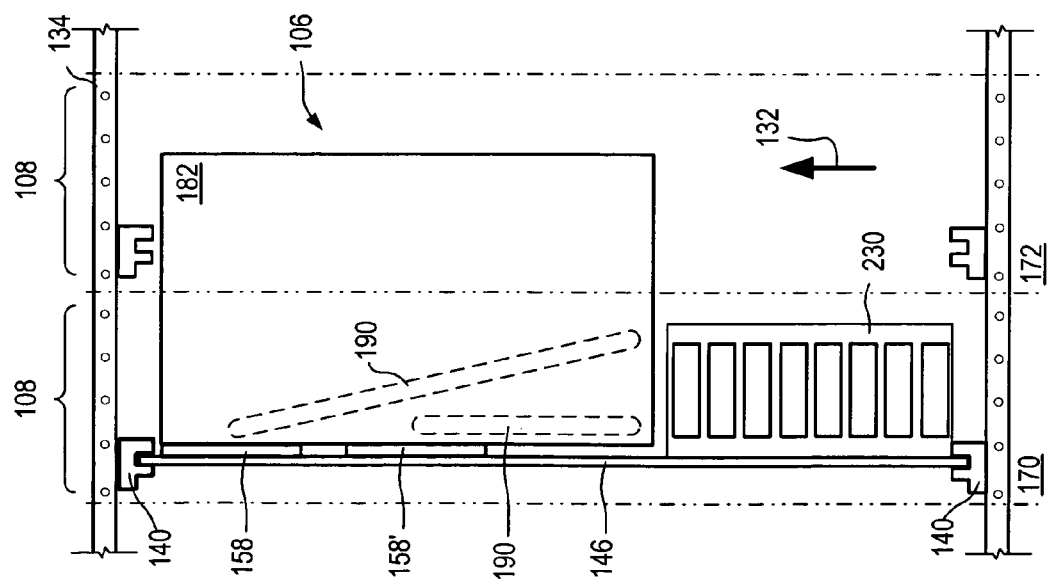
FIG. 19 depicts a front view of a computer system including a multiple processor module in two slots of a system.

In an embodiment, two or more components (e.g., processors) on a circuit board may be cooled using separate, diverging heat pipes. FIGS. 19 and 20 depict front module 106 in subrack 134. Front module 106 may include an array of processors 158, 158' on upper portion of circuit board 146. DIMM riser boards 230 may be mounted on a lower portion of circuit board 146.

Heat sink 182 may be coupled to processors 158, 158'. Heat pipes 190 may be embedded in heat sinks 182. Condenser ends 194 of heat pipes 190 may be located upstream from processors 158, 158'. Heat pipes 190 for downstream processors 158 may diverge from heat pipes 190 for upstream processors 158' toward condenser ends 194 of heat pipes 190. In some embodiments, a longitudinal axis of heat pipes 190 may be parallel to a plane of circuit board 146. In other embodiments, a longitudinal axis of heat pipe 190 may angle relative to a plane of circuit board 146.

In certain embodiments, heat pipes 190 may be arranged in a disconnected "Y" pattern, as shown in FIG. 20. In some embodiments, the upstream and downstream components may be in-line with one another along a direction of cooling air flow through or across heat sink 182 (e.g., in the direction of arrow 132). Spacing between heat pipes 190 for upstream processor 158' and downstream processor 158 may inhibit cross-heating between heat pipes 190. In certain embodiments, a thermally insulative barrier (e.g., a ceramic insert, an air pocket) may be provided between evaporator ends 192 of heat pipes 190 to isolate upstream processors 158' from downstream processors 158.

In one embodiment, as shown in FIG. 20, 6 processors 158, 158' may be included on an upper portion of front module 106. As shown in FIG. 19, front module 106 may fill two standard slots in a PICMG 3.0-compliant subrack. Providing an array of processors on a module may allow for increased routing efficiency among the processors and/or other elements of a system (e.g., conductors of a fabric interface or base interface).

In the context of this patent, the term "coupled" includes direct coupling or indirect coupling (e.g., with one or more intervening elements). For example, a front module and a rear module may be coupled by directly attaching the front module to the rear module or by attaching each of the front and rear modules to one or more intervening elements (e.g., an interconnect circuit board).

While the present invention has been described with reference to particular embodiments, it will be understood that the embodiments are illustrative and that the invention scope is not so limited. Any variations, modifications, additions, and improvements to the embodiments described are possible. These variations, modifications, additions, and improvements may fall within the scope of the inventions as detailed within the following claims. For example, when the terms "front," "rear," "vertical," "horizontal" "upward", "downward," "under", "over," "left," or "right" are used in the claims, they are to be understood to relate to the Figures as illustrated. However, the device may be turned at an angle to the horizontal or inverted with the quoted terms referring to the altered orientation. As another example, shared heat pipes as described herein may be incorporated into a set of modules carried on a converter cage assembly. As yet another example, a module mounted to an offset bracket may include a downstream power section as described herein.

What is claimed is:

1. A computer system comprising:
a housing;
a module support structure coupled to the housing;
a backplane coupled to the housing; and
a module received in the module support structure and coupled to the backplane, the module comprising a power section and a data section, the power section being located above the data section; the module support structure being configured to allow cooling air to flow upwardly across the module.

2. The computer system of claim 1, wherein the form factor of the module substantially conforms to a PICMG 3.0 specification, wherein the module support structure and the backplane are configured to receive the module in a vertically inverted orientation relative to a standard orientation of a PICMG 3.0 specification.

3. The computer system of claim 1, further comprising a power connector configured to couple the module to the backplane, wherein a module part of the power connector and the power section are located on an upper portion of the module.

4. The computer system of claim 1, wherein the power connector conforms to a Zone 1 connector of a PICMG 3.0 specification.

5. The computer system of claim 1, wherein the module support structure and the backplane are configured to receive a plurality of PICMG 3.0-compliant modules in a vertically inverted orientation relative to a standard orientation of a PICMG 3.0 specification.

6. The computer system of claim 1, wherein data section comprises a processor.

7. The computer system of claim 1, further comprising a cooling air device coupled to the housing, wherein the cooling air device is configured to draw air over the modules.

8. The computer system of claim 1, wherein the module is located in front of the backplane, the computer system further comprising a rear module located behind the backplane, wherein the housing is configured to allow cooling air to flow upwardly over the module and the rear module.

9. A computer system, comprising:
a module comprising a circuit board; and a module support structure comprising a pair of guides, the module being coupled to the guides such that the circuit board is offset relative to the guides;

wherein the module comprises at least one electronic component on each side of the circuit board, wherein the module is configured to reside within an envelope according to a PICMG 3.0 specification.

10. The computer system of claim 9, further comprising a pair of brackets coupled to the circuit board, wherein the brackets are configured to offset the circuit board from the guides.

11. The computer system of claim 9, wherein the brackets comprise apertures configured to allow a flow of cooling air.

12. The computer system of claim 9, wherein the circuit board is substantially centered in a slot of the system.

13. The computer system of claim 9, wherein the guides are located in the module support structure in conformance with a PICMG 3.0 specification, wherein the circuit board is substantially centered between pitch lines of a standard PICMG 3.0 slot.

14. The computer system of claim 9, wherein the module comprises at least one processor on each side of the circuit board.

15. A computer system, comprising:
a first module comprising a first heat producing component;
a second module spaced from the first module, the second module comprising a second heat producing component; and
a heat sink coupled to the first and second heat producing components between the first and second heat producing components;
wherein the first and second modules are configured to mount in adjacent slots of a PICMG 3.0 compliant subrack.

16. The computer system of claim 15, wherein the modules comprise circuit boards, wherein the heat producing components comprise processors mounted to the circuit boards.

17. The computer system of claim 15, further comprising a heat pipe embedded in the heat sink configured to transfer heat away from the first and second heat producing components.

18. The computer system of claim 15, further comprising:
a first heat pipe configured to transfer heat away from the first heat producing component; and
a second heat pipe configured to transfer heat away from the second heat producing component.

19. The computer system of claim 15, further comprising a heat pipe embedded in the heat sink configured to transfer heat away from the first and second heat producing components, the heat pipe comprising a first evaporator end proximate to the first heat producing component and a second evaporator end proximate to the second heat producing component.

20. A heat sink, comprising:
a body comprising a first surface configured to couple to a first heat producing component and a second surface configured to couple to a second heat producing component;
a first heat pipe embedded in the body, the first heat pipe being configured to transfer heat away from the first heat producing component; and
a second heat pipe embedded in the body, the second heat pipe being configured to transfer heat away from the second heat producing component; the heat pipes comprising condenser ends, the heat pipes being arranged to diverge from one another toward the condenser ends, the heat pipes being arranged in a disconnected "Y" pattern.

21. The heat sink of claim 20, wherein the heat sink comprises at least two pairs of heat pipes arranged in a disconnected "Y" pattern.

22. The heat sink of claim 20, wherein the first and second heat pipes comprise evaporator ends, wherein the body is configured to allow a flow of cooling air through the heat sink along a flow axis, wherein the first and second heat pipes are configured to cool the first and second heat producing components when the first and second heat producing components are substantially aligned along the flow axis.

23. The heat sink of claim 20, further comprising a thermally insulative barrier between the first heat pipe and the second heat pipe.

24. A computer system, comprising:
a module comprising a printed circuit board and a plurality of heat producing components, the module being configured to mount in two spaces of a PICMG 3.0 compliant subrack, the plurality of heat producing components comprising at least 6 processors arranged in rows on the printed circuit board; and
a heat sink coupled to the heat producing components, the heat sink comprising a plurality of heat pipes, the heat pipes configured to transfer heat away from at least at least two of the heat producing components, at least two of the heat pipes being arranged to diverge from one another toward condenser ends of the heat pipes.

25. The computer system of claim 24, wherein the at least two heat pipes are arranged in a disconnected "Y" pattern.

26. The computer system of claim 24, wherein the heat sink comprises at least two pairs of heat pipes arranged in a disconnected "Y" pattern.

* * * * *